United States Patent
Akkermans et al.

(10) Patent No.: US 7,696,930 B2
(45) Date of Patent: Apr. 13, 2010

(54) RADIO FREQUENCY (RF) INTEGRATED CIRCUIT (IC) PACKAGES WITH INTEGRATED APERTURE-COUPLED PATCH ANTENNA(S) IN RING AND/OR OFFSET CAVITIES

(75) Inventors: Johannes A. G. Akkermans, Eindhoven (NL); Brian A. Floyd, Mahopac, NY (US); Duixian Liu, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/102,051

(22) Filed: Apr. 14, 2008

(65) Prior Publication Data

US 2009/0256752 A1 Oct. 15, 2009

(51) Int. Cl.
*H01Q 1/38* (2006.01)
(52) U.S. Cl. .................. 343/700 MS; 343/853
(58) Field of Classification Search .......... 343/700 MS, 343/846, 853; 257/728
See application file for complete search history.

(56) References Cited

U.S. PATENT DOCUMENTS

| | | | |
|---|---|---|---|
| 5,903,239 A * | 5/1999 | Takahashi et al. ..... | 343/700 MS |
| 6,809,688 B2 * | 10/2004 | Yamada ............... | 343/700 MS |
| 6,906,668 B2 | 6/2005 | Rawnick et al. | |
| 7,084,828 B2 | 8/2006 | Rawnick et al. | |
| 7,095,372 B2 * | 8/2006 | Soler Castany et al. ..... | 343/700 MS |
| 7,119,745 B2 | 10/2006 | Gaucher et al. | |
| 7,312,763 B2 * | 12/2007 | Mohamadi ........... | 343/853 |
| 7,321,339 B2 * | 1/2008 | Mohamadi ........... | 343/853 |
| 2002/0007468 A1 | 1/2002 | Kampe et al. | |
| 2006/0033664 A1 | 2/2006 | Soler Castany et al. | |
| 2006/0255946 A1 | 11/2006 | Khatri | |

(Continued)

OTHER PUBLICATIONS

David M. Pozar, "A Review of Aperture Coupled Microstrip Antennas: History Operation, Development, and Applications," University of Massachusetts, Amherst MA (May 1996).

(Continued)

*Primary Examiner*—Tan Ho
(74) *Attorney, Agent, or Firm*—Ryan, Mason & Lewis, LLP

(57) ABSTRACT

A radio-frequency integrated circuit chip package has N integrated aperture-coupled patch antennas, N being at least two, and includes N generally planar patches, and at least one generally planar ground plane spaced inwardly from the N generally planar patches and substantially parallel thereto. The ground plane is formed with at least N coupling aperture slots therein, and the slots are substantially opposed to the patches. N feed lines are spaced inwardly from the ground plane and substantially parallel thereto, and at least one radio frequency chip is spaced inwardly from the feed lines and coupled to the feed lines and the ground plane. A first substrate layer is spaced inwardly from the feed lines, and is formed with a chip-receiving cavity, with the chip located in the chip-receiving cavity. A second substrate layer is interposed in a region between the ground plane and a plane defined by the patch, the patch is formed in a first metal layer, the ground plane is formed in a second metal layer, and the second substrate layer defines an antenna cavity in which the N generally planar patches are located. "Island" and "offset" configurations, as well as fabrication methods, are also disclosed.

15 Claims, 13 Drawing Sheets

U.S. PATENT DOCUMENTS

| | | |
|---|---|---|
| 2006/0256018 A1 | 11/2006 | Soler Castany et al. |
| 2007/0026567 A1 | 2/2007 | Beer et al. |
| 2007/0040689 A1 | 2/2007 | Reynolds |
| 2007/0164868 A1 | 7/2007 | Deavours et al. |
| 2008/0029886 A1 | 2/2008 | Cotte et al. |
| 2008/0068177 A1 | 3/2008 | Copeland |
| 2008/0105966 A1 | 5/2008 | Beer et al. |

OTHER PUBLICATIONS

Zwick et al Broadband Planar Millimeter Wave Dipole with Flip-Chip Interconnect Invited, Proceedings of the 2007 IEEE AP-S International Symposium pp. 5047-5050 Honolulu Hawaii Jun. 10-15, 2007.

Zwick et al, "Broadband Planar Superstrate Antenna for Integrated Millimeterwave Transceivers," IEEE Transactions on Antennas and Propagation, vol. 54, No. 10, Oct. 2006.

U.S. Appl. No. 12/034,023, filed Feb. 20, 2008 titled "Radio Frequency (RF) Integrated Circuit (IC) Packages with Integrated Aperture Coupled Patch Antenna(s)".

U.S. Appl. No. 12/045,377, filed Mar. 10, 2008 titled "Wafer-Scale Phased Array".

U.S. Appl. No. 12/130,562, filed May 30, 2008 titled "Method and Apparatus for Packaging an Integrated Chip and Antenna."

Kenneth K. O et al. "On-Chip Antennas in Silicon ICs and Their Application," IEEE Transactions on Electronic Devices, vol. 52, No. 7, Jul. 2005.

Byung-Wook Min et al., "A Low-Loss Silicon-on-Silicon DC-110-GHZ Resonance-Free Package," IEEE Transactions on Microwave Theory and Techniques, vol. 54, No. 2, Feb. 2006.

U.S. Appl. No. 12/168,328, filed Jul. 7, 2008 titled "Radio Frequency (RF) Integrated Circuit (IC) Packages Having Characteristics Suitable for Mass Production."

U.S. Appl. No. 12/494,671 filed Jun. 30, 2009, titled, Compact Millimeter Wave Packages with Integrated Antennas.

* cited by examiner

RADIO FREQUENCY (RF) INTEGRATED CIRCUIT (IC) PACKAGES WITH INTEGRATED APERTURE-COUPLED PATCH ANTENNA(S) IN RING AND/OR OFFSET CAVITIES

FIELD OF THE INVENTION

The present invention generally relates to communications circuitry, and, more particularly, to radio frequency (RF) integrated circuit (IC) packages.

BACKGROUND OF THE INVENTION in a wireless network, the connectivity and communication between devices is achieved through antennas attached to receivers or transmitters, in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter- or receiver-antennas. With recent progress in semiconductor technology and packaging engineering, the dimensions of these radio communication systems have become smaller. For applications such as wireless universal serial bus (USB), the operating distance is limited to about a meter; and a single antenna with about 7 dBi at 60 GHz will provide the necessary antenna gain. For distances as long as 10 meters (such as wireless video) or longer (such as radar), in point-to-point applications, antenna gains as high as 30 dBi, depending on the application, are required. However, high gain antennas for wireless video applications have very narrow beam widths, so pointing the antenna is very difficult for consumers. Therefore, a radiation pattern steerable array, such as a phased array, is necessary. Phased arrays are also widely used in military radars. However, packaging RF chips with integrated antennas or phased arrays is extremely difficult and very expensive due to the expensive components and extensive labor involved.

SUMMARY OF THE INVENTION

Principles of the present invention provide techniques for implementing RF IC packages with integrated aperture-coupled patch antennas in, for example, ring and/or offset cavities.

In an exemplary embodiment, according to one aspect of the invention, a radio-frequency integrated circuit chip package with N integrated aperture-coupled patch antennas, N being at least two, includes N generally planar patches, and at least one generally planar ground plane spaced inwardly from the N generally planar patches and substantially parallel thereto. The ground plane is formed with at least N coupling aperture slots therein, and the slots are substantially opposed to the patches. Also included are N feed lines spaced inwardly from the ground plane and substantially parallel thereto, at least one radio frequency chip spaced inwardly from the feed lines and coupled to the feed lines and the ground plane, and a first substrate layer spaced inwardly from the feed lines. The first substrate layer is formed with a chip-receiving cavity, and the chip is located in the chip-receiving cavity. An additional element includes a second substrate layer interposed in a region between the ground plane and a plane defined by the patch. The patch is formed in a first metal layer, the ground plane is formed in a second metal layer, and the second substrate layer defines an antenna cavity. The N generally planar patches are located in the antenna cavity.

Optionally, an island is formed in the second substrate layer, within the cavity, thus defining a ring shape of the cavity, and the N generally planar patches are located in the ring shape. The island is substantially opposed to the chip-receiving cavity.

In another optional approach, the antenna cavity is spaced away (offset) from the chip-receiving cavity when viewed in plan, such that loads incurred during insertion of the chip into the chip-receiving cavity are substantially supported away from the antenna cavity.

In another aspect, a method of fabricating a radio-frequency integrated circuit chip package with N integrated aperture-coupled patch antennas, N being at least two, includes the steps of providing a package of the kind described (less the chip), with the optional island as described, and inserting at least one radio frequency chip into the cavity, with the island supporting loads induced by the insertion of the chip into the cavity.

In yet another aspect, a method of fabricating a radio-frequency integrated circuit chip package with N integrated aperture-coupled patch antennas, N being at least two, includes the steps of providing a package of the kind described (less the chip), with the optional offset cavity configuration as described, and inserting at least one radio frequency chip into the cavity, such that loads incurred during insertion of the chip into the chip-receiving cavity are substantially supported away from the antenna cavity.

One or more embodiments of the invention are suitable for automatic processes and reduce the number of components previously involved with packaging antennas.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments of the invention provide an apparatus and method for low cost packages with integrated antennas and phased arrays operating in the millimeter wave (mmWave) range. An exemplary inventive package with integrated antennas is based on a multilayer printed circuit board (PCB). The package contains, for example, a rectangular or ring cavity for implementing high performance antenna(s) or antenna arrays and another cavity housing mmWave radio frequency (RF) integrated circuit chips. One or more embodiments of the invention also provide techniques to overcome the difficulties in making internal cavities and to avoid the need to employ wire bond technology at mmWave frequencies. Embodiments of the inventive packaging technology are consistent with the PCB manufacturing process and can be used for packages with an integrated antenna or antenna array.

Instances of the invention thus provide low cost packaging with integrated antennas or planar phased arrays; in particular, chip packaging with integrated antennas or planar phased array designs for mmWave frequencies and above.

Typical chip packages with integrated antennas have three major parts: (i) an RF chip, (ii) one or more antennas, and (iii) a package carrier (and in some instances, a package lid or cover, or an encapsulant to protect the package). One or more embodiments of the invention provide a package that has high performance antennas, an interface for flip-chipping an RF chip and an interface for flip-chipping the package to a printed circuit mother board.

Figure 1:
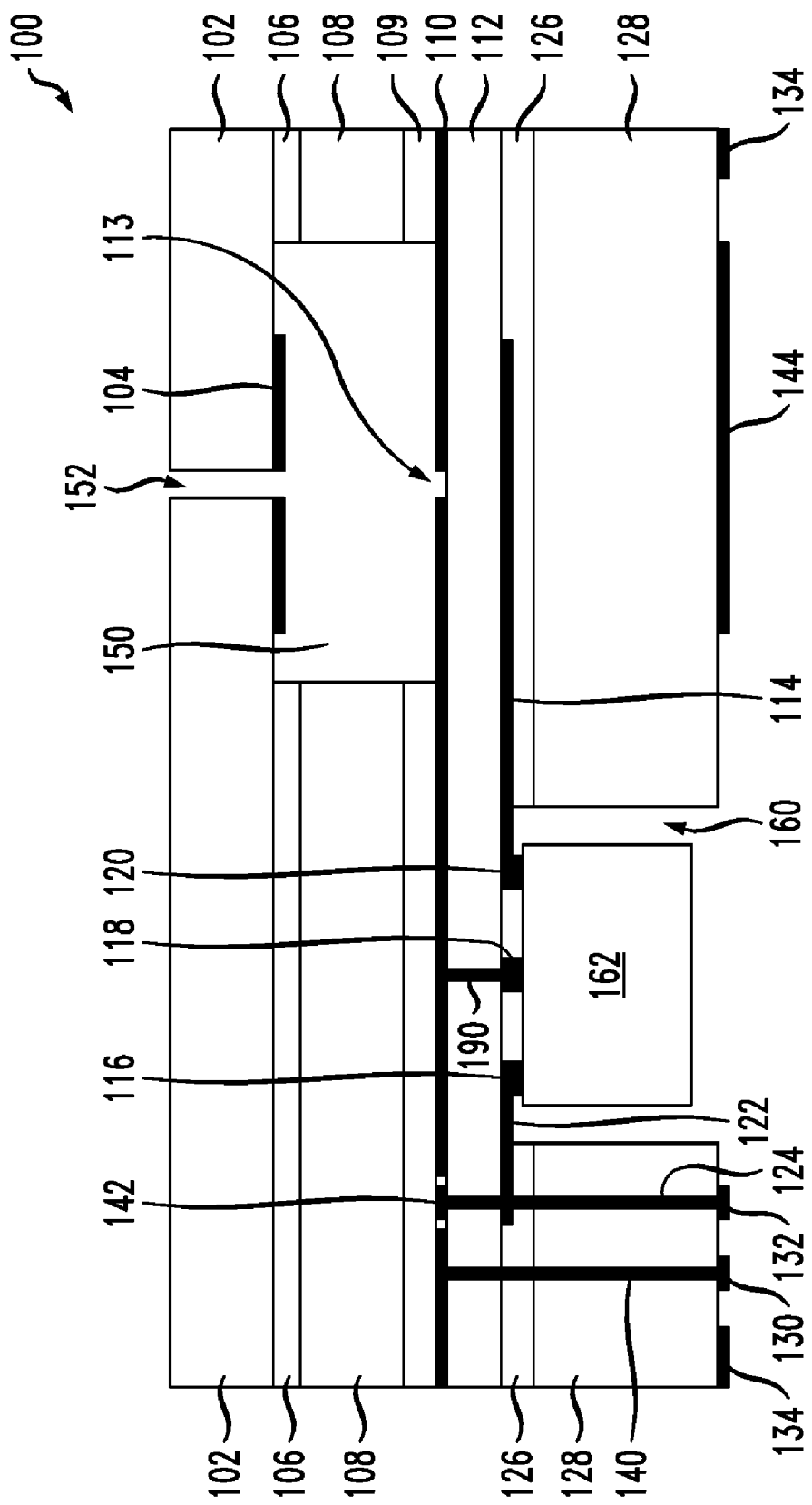
FIG. 1 shows an exemplary embodiment of a package, in cross section, according to an aspect of the invention.

FIG. 1 shows a cross-sectional view of an exemplary package 100, according to an aspect of the invention. Note that section lining is omitted throughout the figures, for clarity. The package has seven total layers, including substrate and bounding layers. For mmWave applications, especially for frequencies above 60 GHz, bounding film and/or layer thickness has to be considered in the design process. Given the teachings herein, a person having ordinary skill in the antenna and packaging arts will know how to take the thickness into account and how to employ high precision PCB fabrication techniques to make embodiments of the invention. The package 100 also has a number of metal layers. In particular, there is an outermost substrate 102. Immediately inward therefrom is a metal layer used for the patch(es) 104 of the patch antenna(s). Inward of the substrate 102 and patch antenna 104 (only a single antenna is depicted in FIG. 1, but more can be provided as discussed below) are a bound film layer 106, another substrate layer 108, and another bound film layer 109. Another metal layer, inward of bound film 109, is used for the ground plane 110 of the patch antenna. Slot(s) 113 on the ground plane are used for the apertures of the aperture-coupled patch antennas. The ground plane 110 also separates the radiating elements (patches) 104 from the feed line(s) and the RF chip(s), discussed below.

Another substrate 112 is inward from ground plane 110. Another metal layer is inward from substrate 112 and is used to implement the antenna feed line(s) 114, pads 116, 118, 120 for RF chip connections (preferably a flip-chip/C4 ("controlled collapse chip connection") type of connection), and interconnection(s) 122 (as appropriate) to one or more vias, such as via 124, in a further bound film layer 126 inward of the metal layer forming feed line 114, and a further substrate 128 inward of bound film 126. A still further metal layer provides all the pads for signal, control, power supply, and ground connections to the mother PCB (the mother PCB is omitted from the figure for clarity). Pads may include ground pad 130 interconnected with ground plane 110 through ground via 140, as well as one or more of signal, power, and control pads exemplified by pad 132 connected to interconnection 122 and antipad 142 by via 124. The vias may be, for example, plated through holes. Package pads 134 may also be provided. Depending on the patch antenna design, an optional reflector 144 can also be implemented on the same metal layer as the pads 130, 132, 134. In some instances, as discussed below, the reflector 144 is embedded.

To implement the flip-chip approach, the chip 162 preferably has a plurality of solder dots connected directly to the chip connection pads 116, 118, 120.

To enhance the patch antenna bandwidth, patches may be air suspended or supported with a foam material with a dielectric constant close to one at low frequency applications. However, at mmWave frequencies, especially for package applications, air suspended or foam supported patches are not realistic. Thus, in one or more embodiments of the invention, an air cavity 150 can be implemented in the packages. To avoid issues from hot gases during the PCB manufacturing process, vent hole(s) 152 can be employed. These holes can be designed such that they have little effect on the antenna performance. For example, hole 152 can be located near the middle of the cavity 150 or close to the edge of the cavity 150, and can be made relatively small, consistent with adequate venting. The vent holes can be on the top (outermost part of) the cavity 150 as shown in FIG. 1 or on the side of the cavity as discussed below, depending on the manufacturing process used.

The ground plane 110 is also used for making ground connections through vias (e.g., via 140) and signal, power, and control connections through vias and antipads (e.g., via 124 with antipad 142, illustrative of a via with antipad that could be used for signal, power, or control functionality). Antipads are beneficial from a manufacturing standpoint, and result in increased reliability, as it is difficult to achieve reliability in partial vias (i.e., vias such as via 124 that do not extend completely through a structure) without use of antipads.

An open chip-receiving cavity or socket 160 is realized in the substrate 128 and bound film 126. This socket is used to hold the RF chip 162. The chip is attached to the package through flip-chip bonding.

Note that all the mmWave components (antennas, power amplifiers, low noise amplifiers, and the like) are in the package 100. Vias 124, 140 are used to pass through DC or much lower frequency signals.

The package 100 may advantageously be attached to the mother board (not shown) through a ball grid array (BGA).

Figure 2:
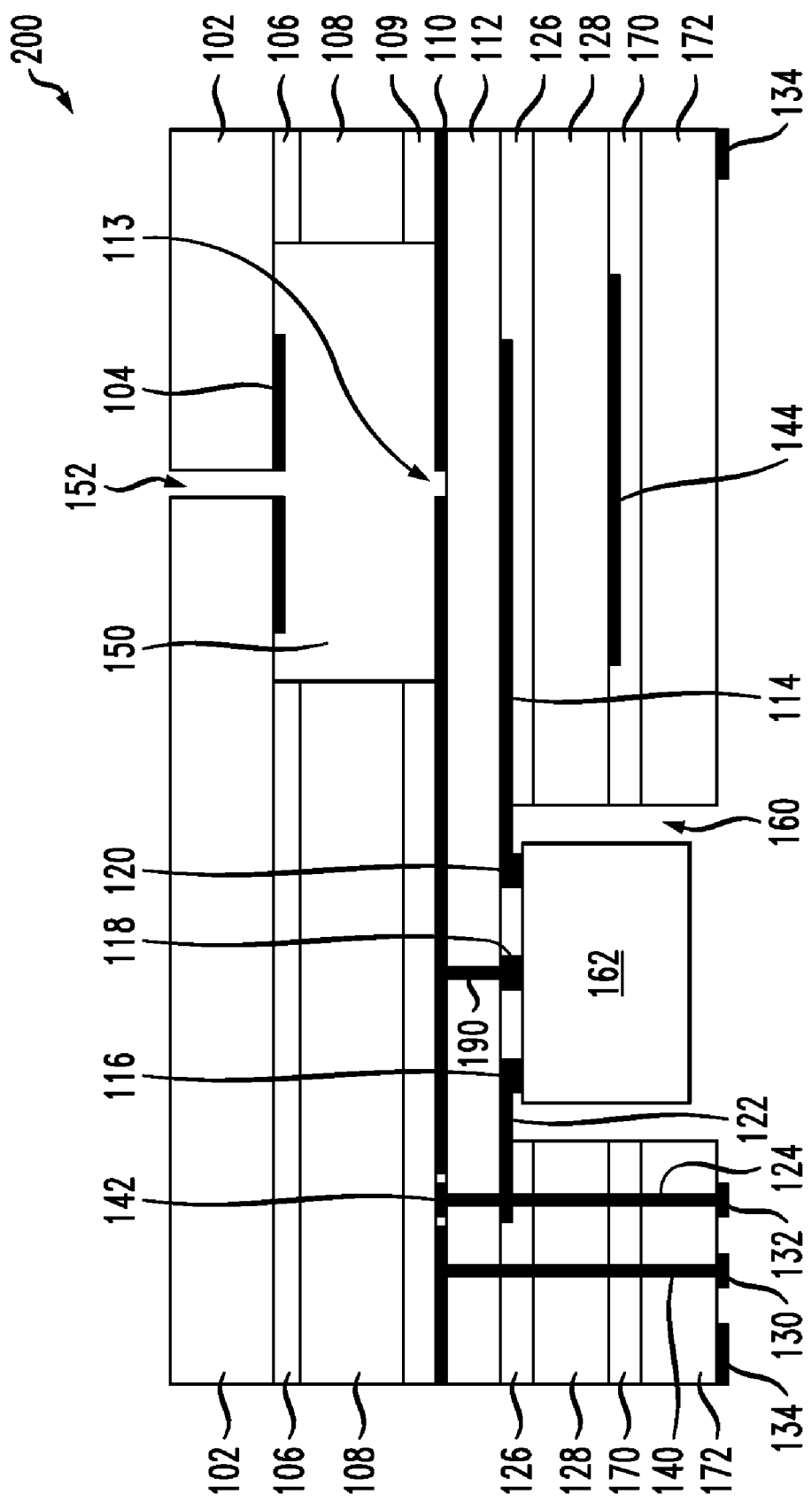
FIG. 2 shows an exemplary embodiment of another package, in cross section, according to another aspect of the invention.

FIG. 2 shows an embodiment 200 substantially similar to embodiment 100 except that reflector 144 is encapsulated by an additional bound layer 170 inward of reflector 144 and an additional substrate 172 inward of bound layer 170. Similar items have received the same reference number and will not be described again. Chip receiving socket 160 is also formed in substrate 172 and bound layer 170 in this embodiment.

Figure 3:
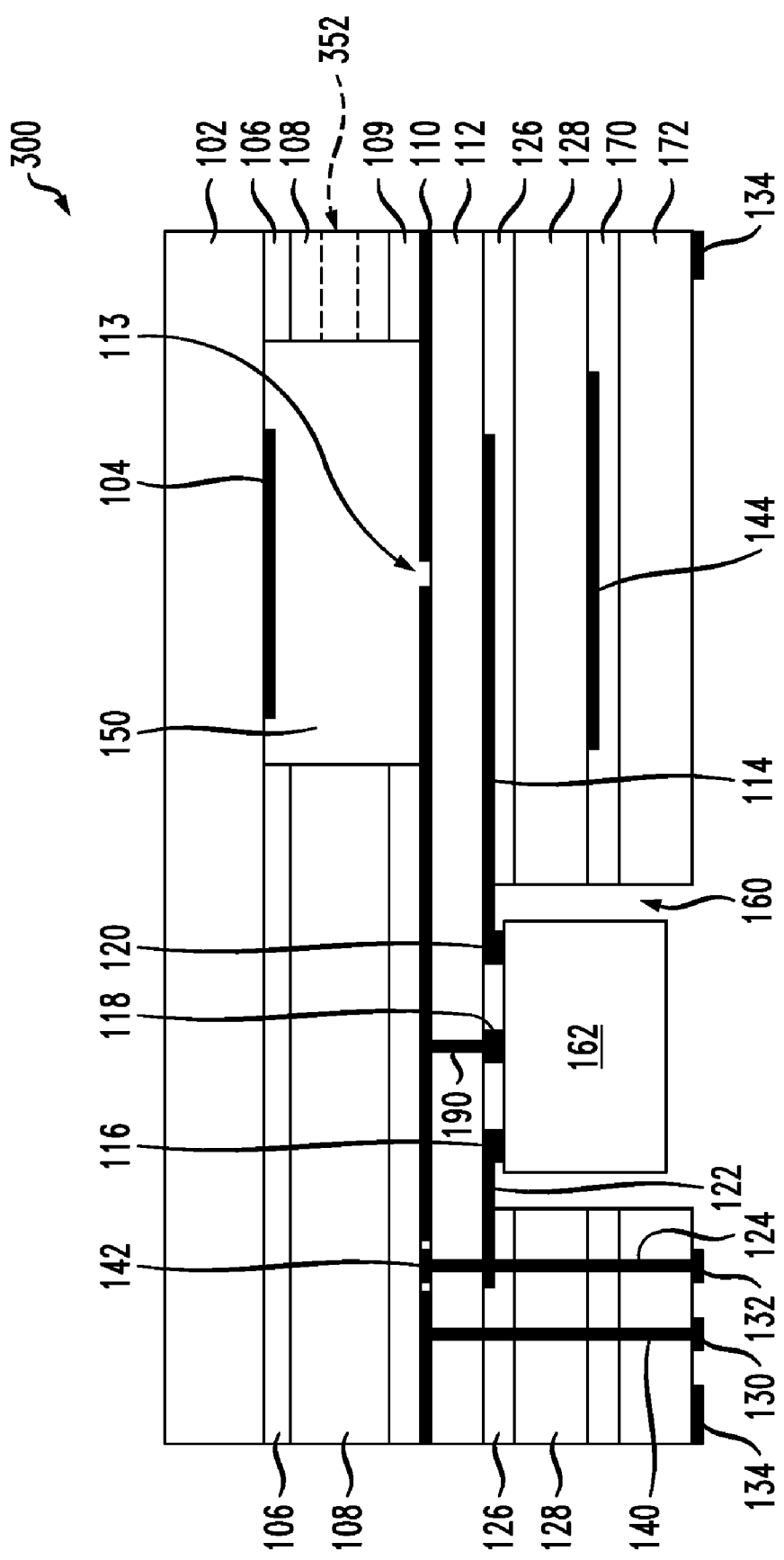
FIG. 3 shows an exemplary embodiment of yet another package, in cross section, according to yet another aspect of the invention.

FIG. 3 shows an embodiment 300 substantially similar to embodiment 200 except that vent 352 runs sideways through layer 108 so as to vent cavity 150. Similar items have received the same reference number and will not be described again.

Figure 4:
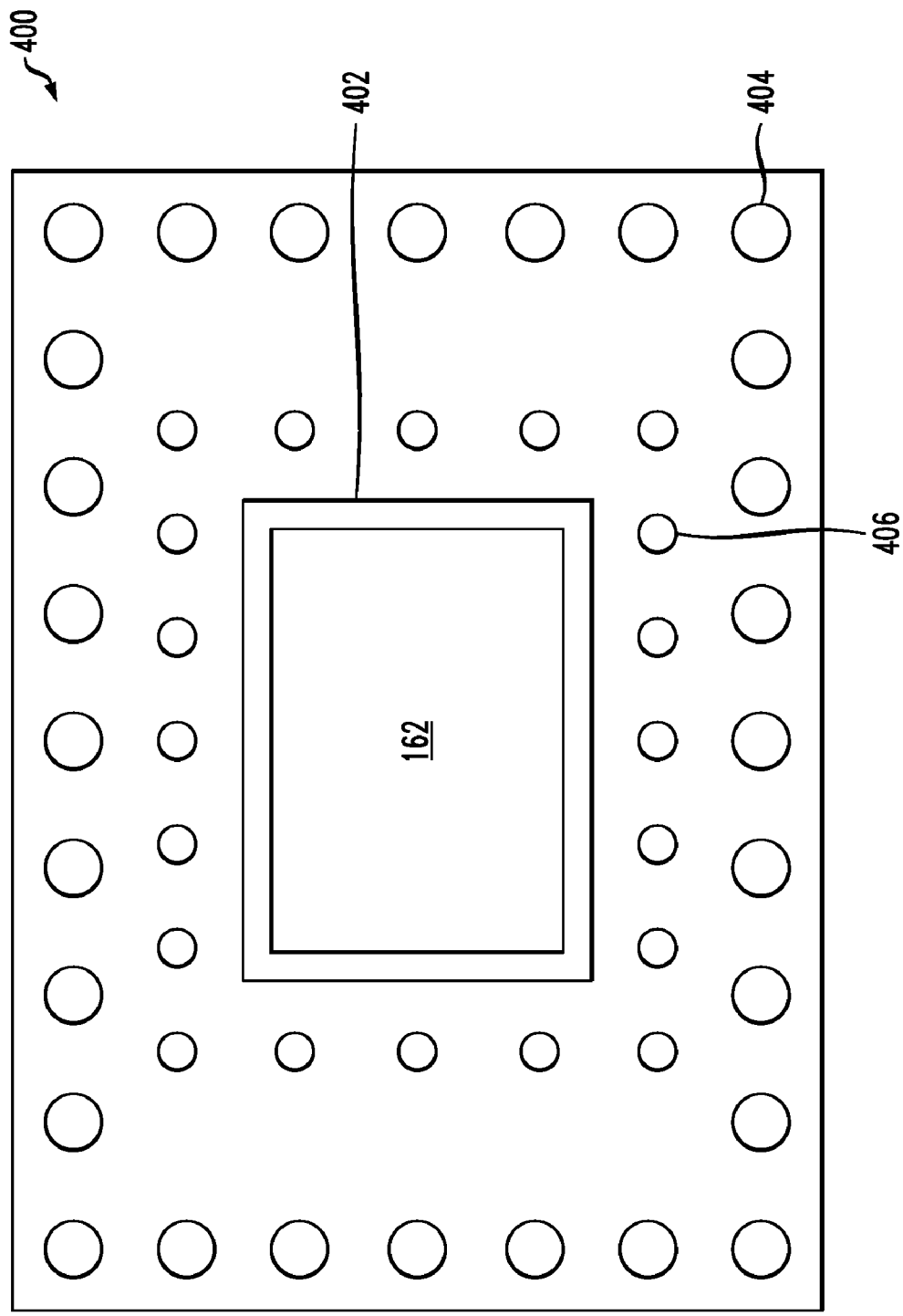
FIG. 4 is a bottom view of an exemplary package with no reflector or an embedded reflector.
Figure 5:
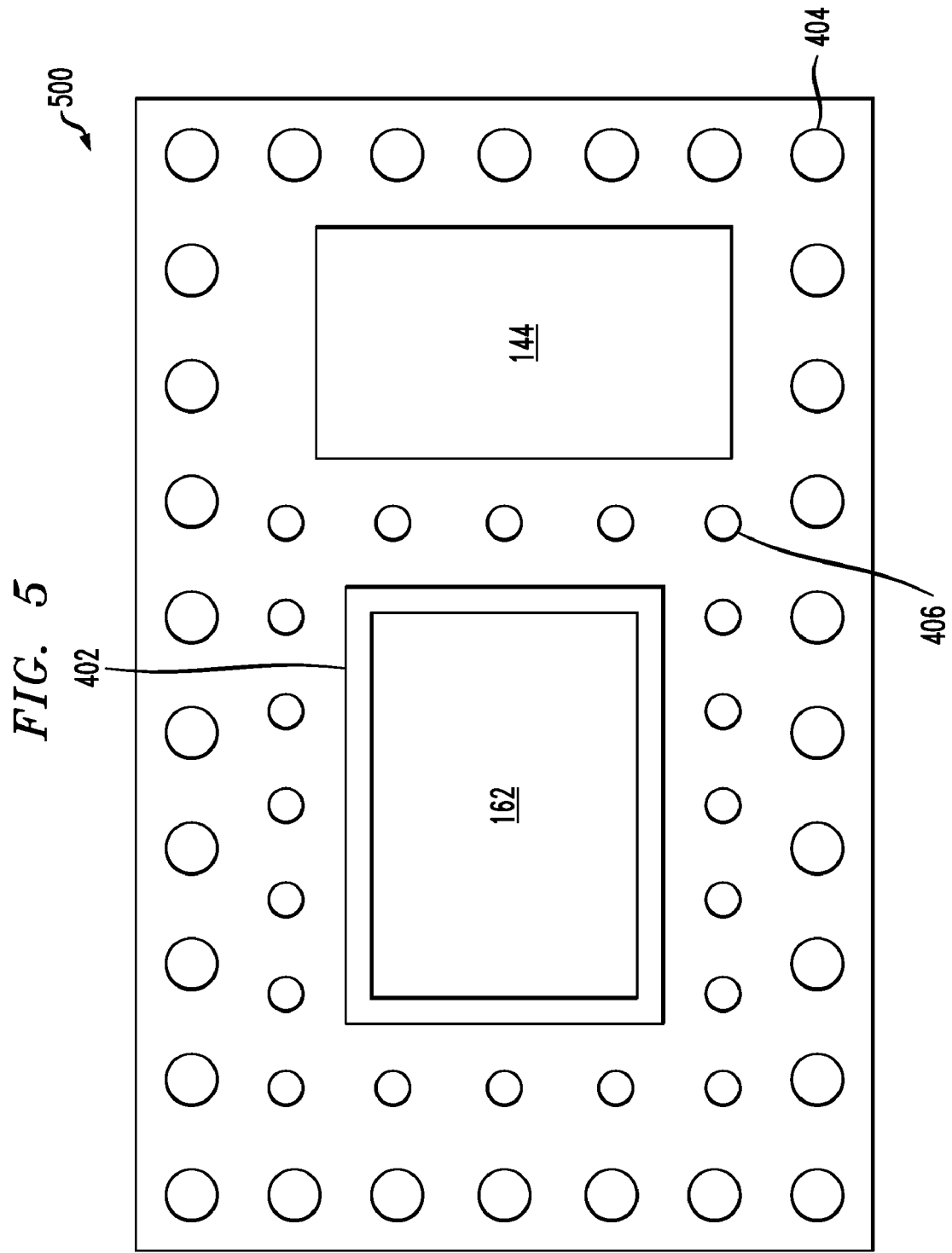
FIG. 5 is a bottom view of an exemplary package with a visible reflector.

FIG. 4 presents a bottom view 400 where chip 162 is encapsulated with encapsulant 402. The chip can be partially or completely encapsulated, for example, for purposes of resisting humidity. A plurality of outer pads 404 may correspond, for example, to attachment, heat conduction, or ground pads such as pad 130, while a plurality of inner pads 406 may correspond, for example, to signal, control, or power pads such as pad 132. In FIG. 4, there is no reflector or the reflector is embedded. FIG. 5 shows a view 500 similar to view 400 but of a package with a reflector 144, such as in FIG. 1. Similar items have received the same reference number and will not be described again.

Figure 6:
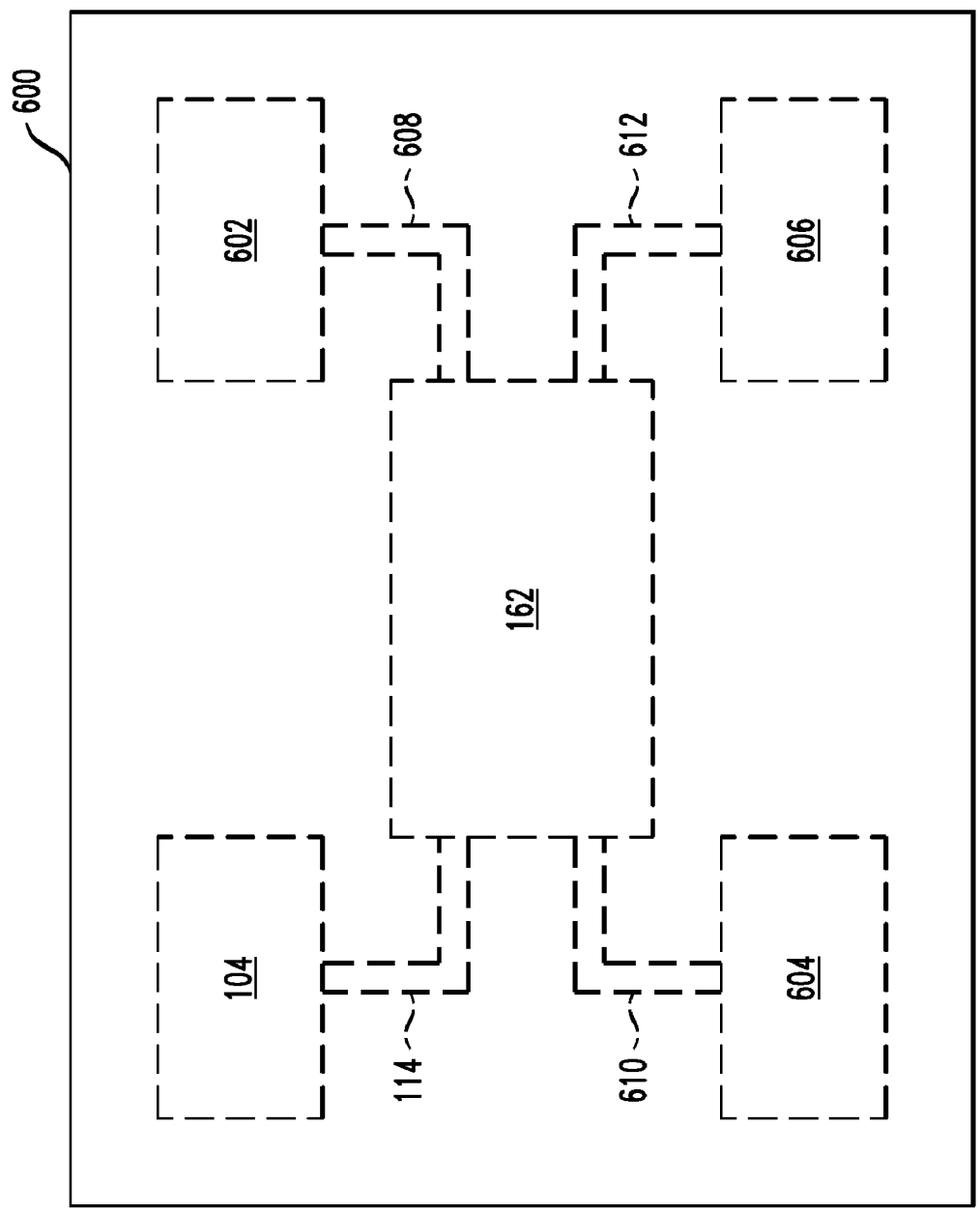
FIG. 6 is a bottom view of an exemplary planar phased array embodiment.

FIG. 6 shows an exemplary package 600 with a 2×2 planar phased array layout. It is possible to have more than two antennas on each row. This basic 2×2 array can be used to form much larger arrays. In addition to first antenna patch 104 with first feed line 114, also included are second, third and fourth antenna patches 602, 604, 606 with corresponding second, third and fourth feed lines 608, 610, 612. Each feed line is connected to chip 162 as described above. Although, for purposes of illustrative convenience, the feed lines are shown ending at the patches in FIG. 6, it will be appreciated that they may overlap the corresponding patches when viewed in top or bottom plan views, and are spaced from the corresponding patch and coupling aperture when viewed in cross-section as shown in FIGS. 1-3 (for example, one end of the feed line passes the center of the patch (FIG. 17) or stays at the center (FIG. 18). The other end of the feed line goes just past the edge of the RF chip).

It will thus be appreciated that aspects of the invention include a package with a socket for an RF chip, and a planar antenna. In one or more instances, the RF chip is flip-chip attached to the package. Internal cavities can be used to improve the patch bandwidth. Venting holes can be used to remove the hot gases during the PCB manufacturing process. The package can be attached to the mother PCB through a BGA. The package can implement a planar phased array.

In view of the discussion of FIGS. 1-6, it will be appreciated that, in general terms, an aperture-coupled patch antenna package, according to an aspect of the invention, can include at least one generally planar patch, such as patch 104. Also included is at least one generally planar ground plane, such as plane 110, spaced inwardly from the generally planar patch 104 and substantially parallel thereto. The ground plane is formed with at least one coupling aperture slot, such as slot 113, therein. The slot 113 is substantially opposed to the patch 104. At least one feed line, such as line 114, is spaced inwardly from the ground plane 110 and is substantially parallel thereto. At least one radio frequency chip, such as chip 162, is spaced inwardly from the feed line 114 and is coupled to the feed line 114 and the ground plane 110. Also included is a first substrate layer, such as that formed by bound film 126 and substrate 128, spaced inwardly from the feed line 114. The first substrate layer is formed with a chip-receiving cavity, such as cavity 160. The chip 162 is located in the chip-receiving cavity 160.

Given the description herein, a person skilled in the PCB and antenna arts can make embodiments of the invention. Non-limiting examples of materials that may be used include thermoset plastic/ceramic/woven glass or similar laminates such as the Rogers RO4000® series of materials (and other compatible materials) available from Rogers Corporation of Rogers, Conn. USA, as well as copper for metal layers, possibly gold-plated on pads or other exposed areas. Similar techniques can be used for all the depicted embodiments, including FIGS. 1-18.

It will be appreciated that advantageously, embodiments of the invention, such as 100, 200, and 300, provide a complete package and not a mere patch antenna separate from the chip and other packaging.

Note that vias such as 124, 140 may be formed, for example, using plated through holes.

Embodiments of the invention may also include a second substrate layer, such as that formed by substrate 108 and bound films 106, 109, interposed in a region between the ground plane 110 and a plane defined by the patch 104. The patch 104 may be advantageously formed in a first metal layer and the ground plane 110 may be advantageously formed in a second metal layer.

In one or more embodiments, a third substrate layer, such as that formed by substrate 112, is interposed in a region between the ground plane 110 and the feed line 114. The feed line 114 may be advantageously formed in a third metal layer. Further, one or more packages in accordance with embodiments of the invention may include at least one via, such as via 190, formed in the third substrate layer 1112 and coupled to the ground plane 110. A plurality of chip connection pads, such as pads 116, 118, 120, can be formed in the third metal layer. At least one of the chip connection pads, such as 118, can be coupled to the at least one via 190 in the third substrate layer. The chip connection pads couple the chip to the feed line 114 (pad 120), the via 190 (pad 118) and the via 124 (pad 116).

One or more embodiments of the invention may include one or more signals pads, one or more control pads, and one or more power supply pads, all of which are exemplified by pad 132, as well as one or more ground pads, such as 130. The signal, control, power supply and ground pads are advantageously formed in a fourth metal layer. As noted, package pads 134 can optionally be provided.

Also included in one or more embodiments is at least one ground via, such as 140, coupling the ground plane 110 and the ground pad 130. The at least one ground via 140 passes through the first and third substrate layers (e.g., substrate 112, bound film 126, and substrate 128), in a region not intersecting the feed line 114. One or more embodiments include at least one each of power, signal, and control antipads, such as antipad 142, formed substantially coplanar with the ground plane 110. At least one signal via couples the signal antipad and the signal pad, and passes through the first and third substrate layers. Similarly, at least one power via couples the power antipad and the power pad, and passes through the first and third substrate layers. Furthermore, at least one control via couples the control antipad and the control pad, and passes through the first and third substrate layers. As noted, pad 132, via 124, and antipad 142 are illustrative of pad, via, and antipad elements that may be provided for power, signal, and control functionality.

As also noted, in some instances, a reflector, such as 144, is spaced inwardly from the third substrate layer and is generally opposed to the coupling aperture slot 113. The reflector can be located on an inner surface of the first substrate layer (e.g., inmost surface of substrate 128). The reflector can be exposed, as in FIG. 1, or embedded, as in FIGS. 2 and 3, in which case the package can include a fourth substrate layer, such as that formed by bound film 170 and substrate 172, spaced inwardly from the reflector 144. The reflector can thus be embedded between the first and fourth substrate layers.

Advantageously, the second substrate layer, such as that formed by films 106, 109 and substrate 108, is formed with an air cavity, such as cavity 150, therein. Air cavity 150 is located between the patch 104 and the coupling aperture slot 113 in the ground plane 110. Preferably, the air cavity is formed in communication with a vent, such as vent 152 or 352. In the latter case, as in FIG. 3, the vent 352 is formed in the second substrate layer; in particular, in substrate 108. In the former case, vent 152 is formed in an additional substrate layer, such as that formed by substrate 102, spaced outwardly from the patch 104. The patch is formed on the additional substrate layer 102, and the vent is formed in the additional substrate layer 102.

As noted with regard to FIG. 6, in one or more embodiments of the invention, two or more patches are implemented to form a planar phased array. Thus, in general terms, the above-discussed patch 104 may be designated as a first patch, and the above-discussed feed line 114 is a first feed line. The ground plane can be formed with one or more additional coupling aperture slots, like slot 113. The package can include one or more additional generally planar patches, such as patches 602, 604, 606, spaced outwardly from the ground plane. The additional slots can be substantially opposed to the additional patches. The package can also include one or more additional feed lines, such as lines 608, 610, 614, spaced inwardly from the ground plane and substantially parallel thereto. The at least one radio frequency chip 162 is coupled to the additional feed line(s) and the first patch and additional patch(es) are arranged to form a planar phased array. A single large ground plane with multiple slots can be employed in phased array embodiments. A phased array can include any number of patches greater than or equal to two; however, powers of two are advantageous, e.g., 2, 4, 8, 16, 32, and so on.

For array applications, the spacing between the antenna elements is approximately one-half of the free space wavelength (for example, about 2.5 mm at 60 GHz). Thus, it is challenging to implement multiple cavities for antennas, as the cavity wall is too thin. Embodiments of the invention which address this issue will be discussed with regard to FIGS. 7-18. One or more of such embodiments advantageously provide ease of fabrication in the case of arrays.

Figure 7:
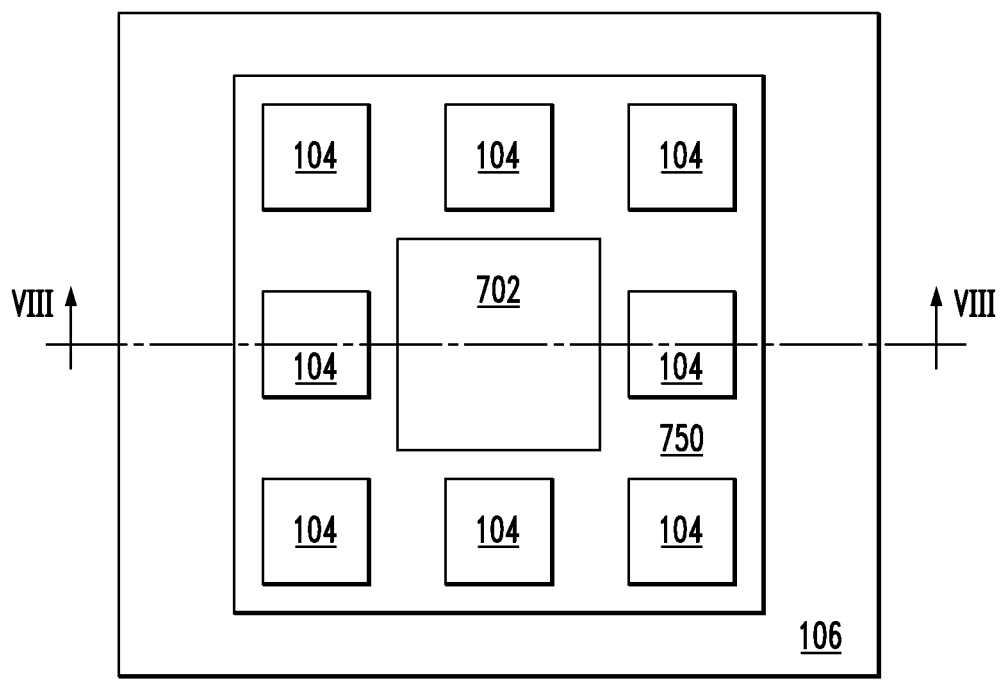
FIG. 7 is a top view of a rectangular ring cavity package, according to a further aspect of the invention (please note that the terms top view and plan view are used interchangeably herein)
Figure 8:
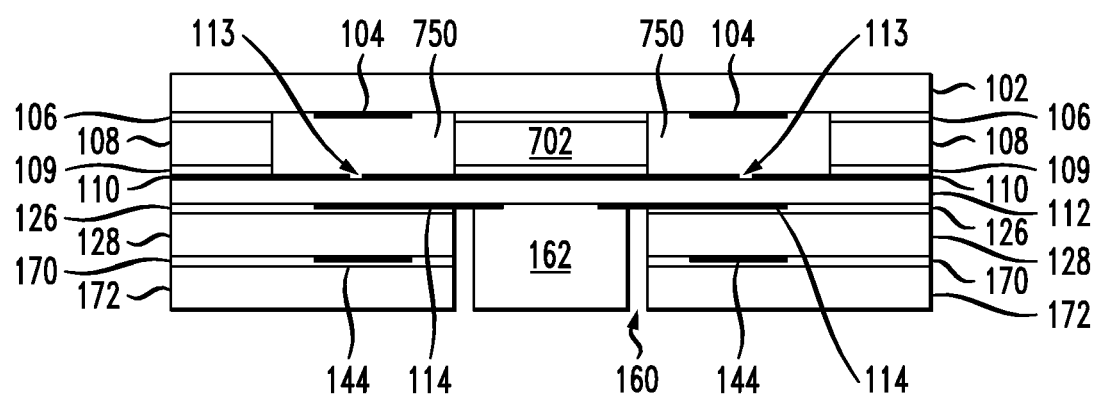
FIG. 8 is a cross section taken along line VIII-VIII in FIG. 7.
Figure 9:
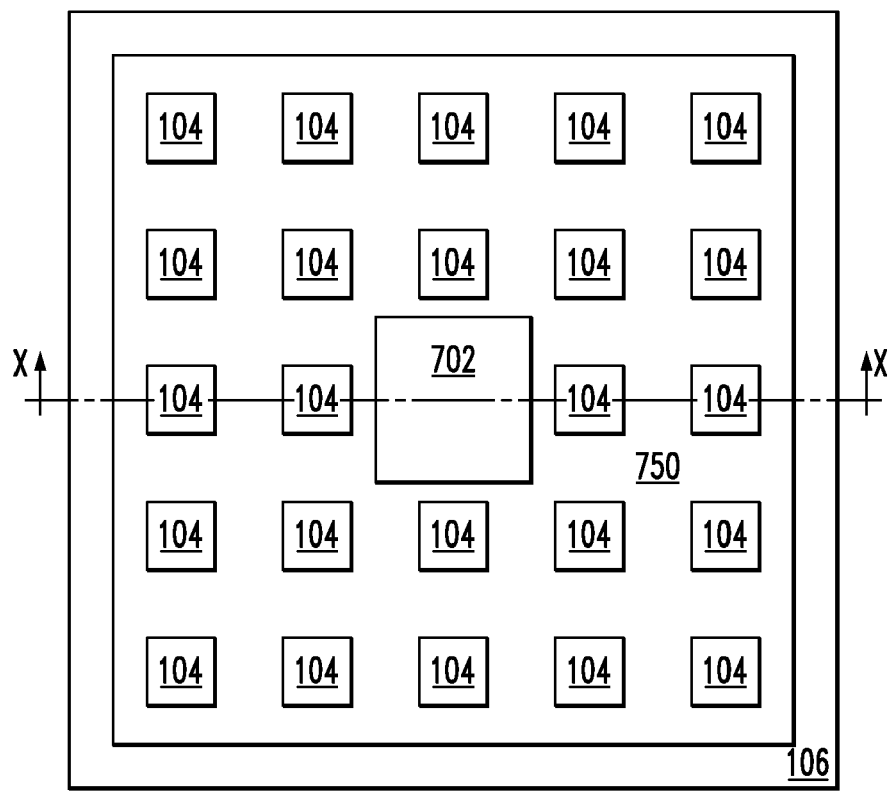
FIG. 9 is a larger version of the package of FIG. 7.
Figure 10:
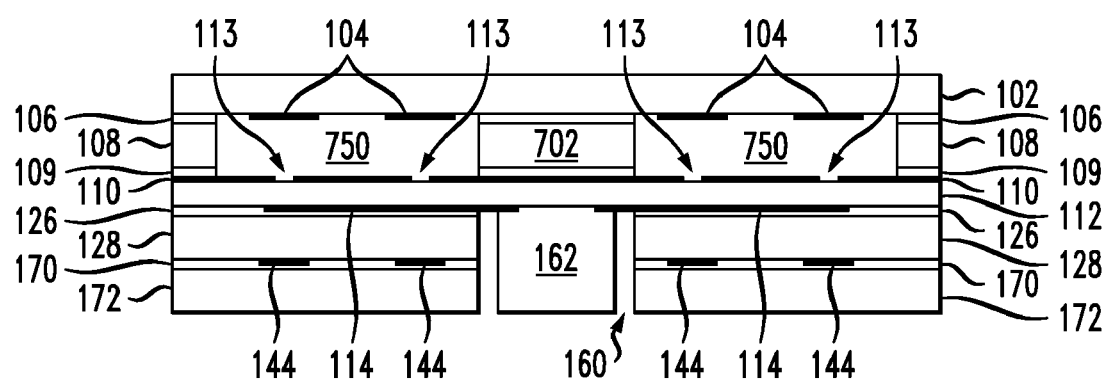
FIG. 10 is a cross section taken along line X-X in FIG. 9.
Figure 11:
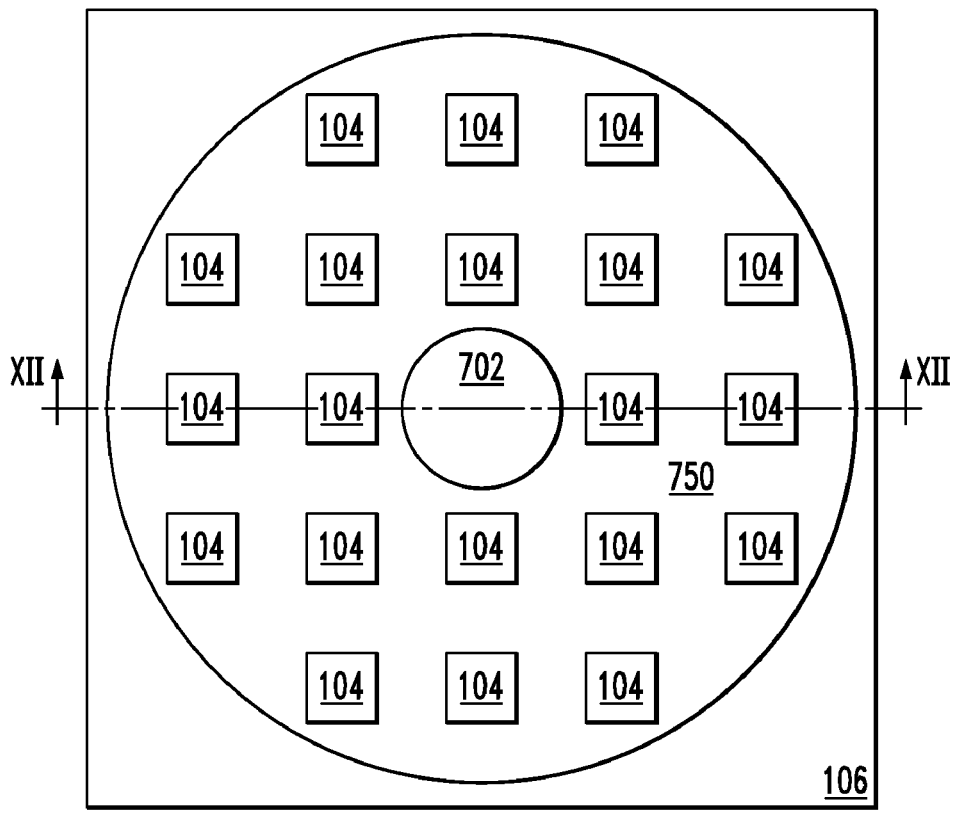
FIG. 11 is a top view of a circular ring cavity package, according to yet a further aspect of the invention.

FIGS. 7 and 8 show, respectively, the top and cross-sectional views of an exemplary package embodiment with integrated antennas. Elements similar to those described in the previous figures have received the same reference character. As seen in FIG. 8, the package has the same "stackup" as the existing package in FIG. 3 (pads and vias omitted for clarity). However, there is a rectangular ring cavity 750 for all antennas, to help the antenna to have wide bandwidth and high efficiency. There is also a center island 702 to support the package cover 102 so the cover will not sag. The island 702 is also desirable so that the package will not deform during the attachment of chip 162. With this configuration, more than one antenna ring is possible (as seen in FIGS. 9 and 11) and the antenna feed lines 114 can be very short. Island 702 can include layers 106, 108, 109, and can be formed, for example, by milling cavity 750 into those layers. FIGS. 9 and 10 are similar to FIGS. 7 and 8, but with a larger cavity 750 holding more antennas.

Figure 12:
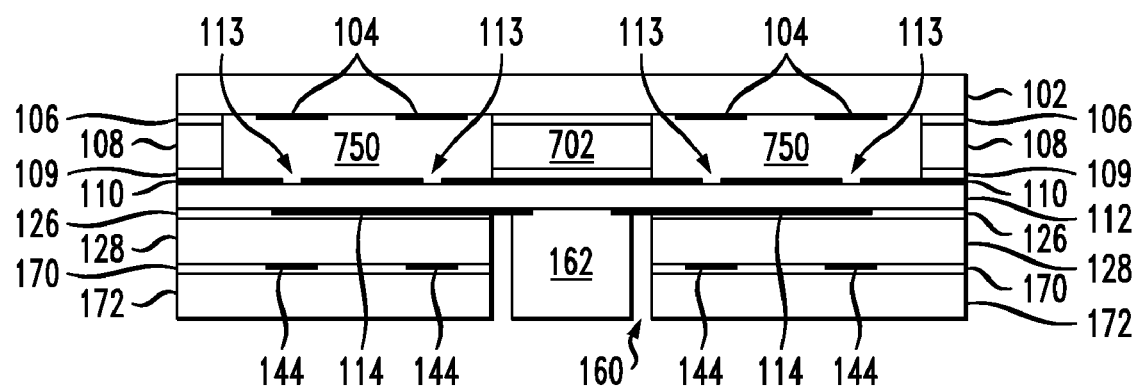
FIG. 12 is a cross section taken along line XII-XII in FIG. 11.
Figure 13:
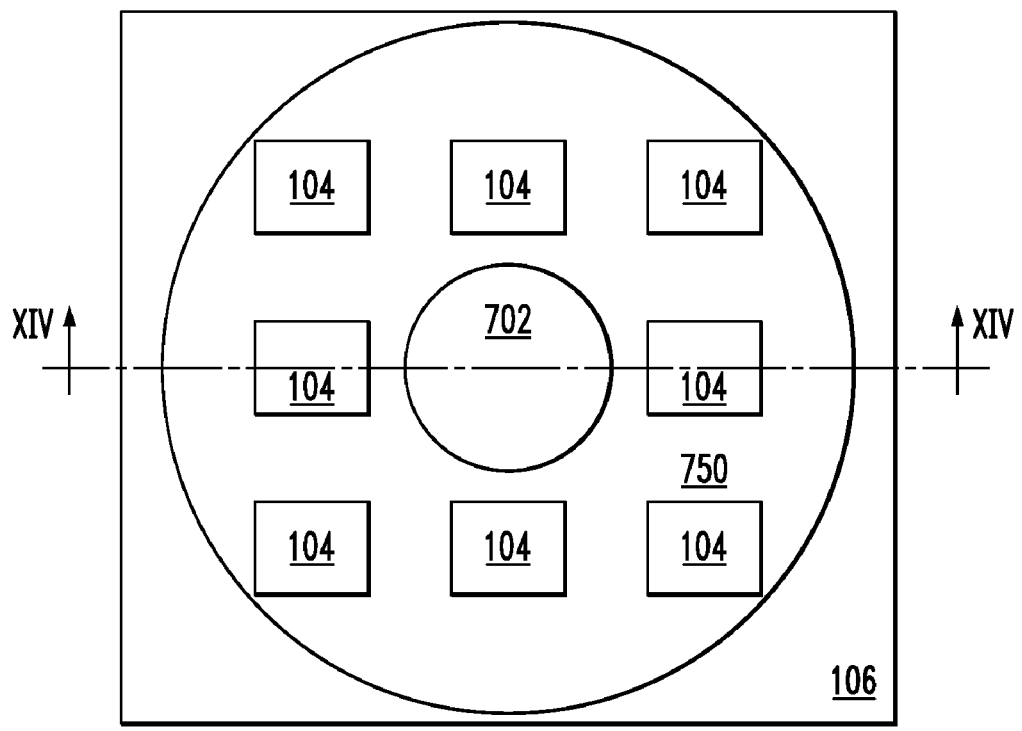
FIG. 13 is a smaller version of the package of FIG. 11.
Figure 14:
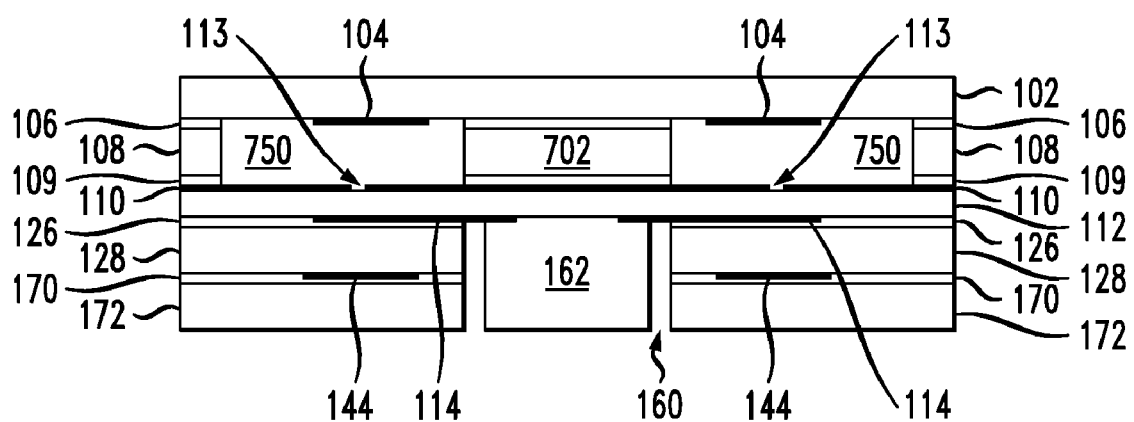
FIG. 14 is a cross section taken along line XIV-XIV in FIG. 13.

FIGS. 11 and 12 show, respectively, the top and cross-sectional views of another exemplary package embodiment with integrated antennas. Here, a circular ring cavity 750 is employed. Circular ring cavity 750 may, in at least some instances, be easier to manufacture (since circular shapes tend to be easier to mill) than the rectangular ring cavity shown in FIGS. 7-10. Island 702 is also circular in this embodiment. FIGS. 13 and 14 are similar to FIGS. 11 and 12, but with a smaller cavity 750 holding fewer antennas. Simulations indicate that in at least some instances, circular arrays have slightly better radiation patterns than rectangular arrays.

Figure 15:
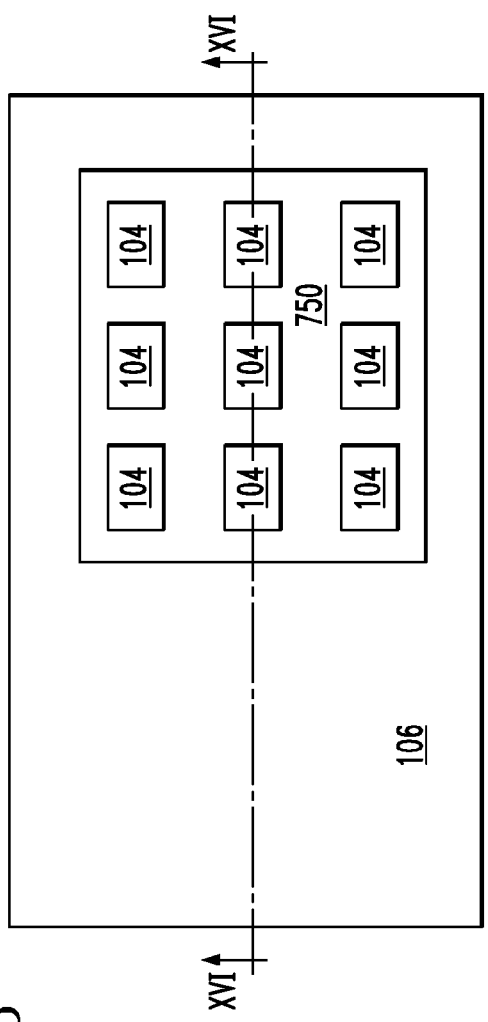
FIG. 15 is a top view of an offset (side-by-side) cavity package, according to a still further aspect of the invention.
Figure 16:
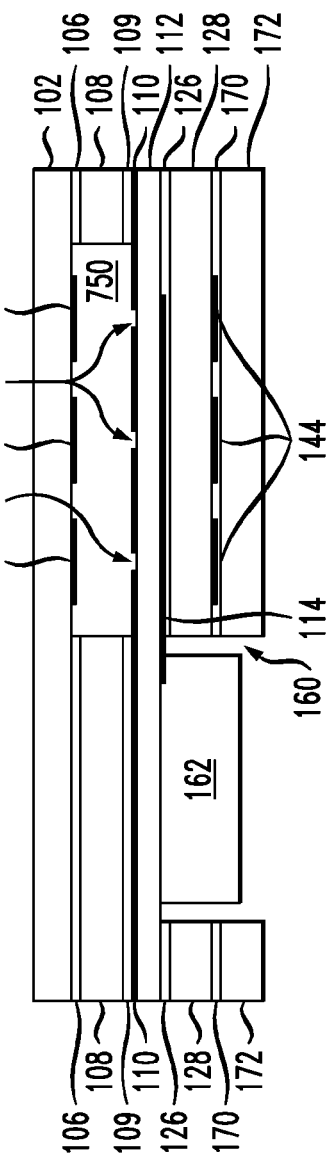
FIG. 16 is a cross section taken along line XVI-XVI in FIG. 15.

For smaller arrays, an offset or side-by-side configuration is possible, as shown in FIGS. 15 and 16. The RF chip 162 is typically much smaller than the antenna arrays. Thus, this configuration will not increase the package size much. However, the feed lines 114 will be longer than the configurations shown in FIGS. 7-14, and thus, the approach of FIGS. 15 and 16 is advantageous for small array applications. Offsetting chip 162 in cavity 160 from antenna cavity 750 prevents undesirable deflection and stress when chip 162 is mounted in cavity 160, as the layers 102, 106, 108, 109, 110, 112 above cavity 160 provide support, and thus, no island is needed in cavity 750. The antenna radiation patterns are also slightly better in the offset case than the patterns for the ring cavity case, since the array is completely filed. However, in at least some instances, the array feed lines are more challenging to design in the offset case, especially for larger arrays.

Figure 17:
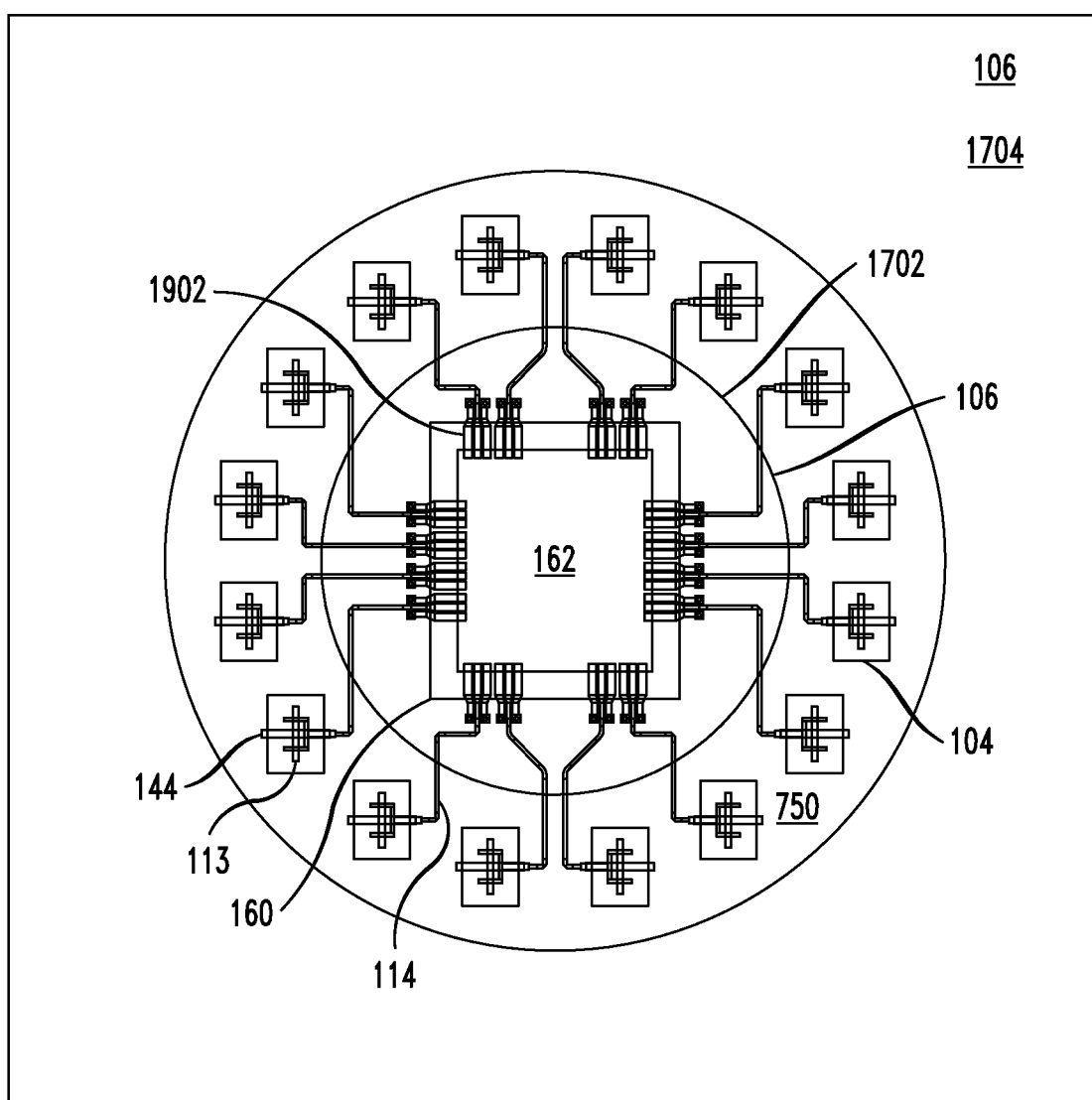
FIG. 17 is a top view of an exemplary sixteen antenna phased-array configuration, according to an even further aspect of the invention.
Figure 18:
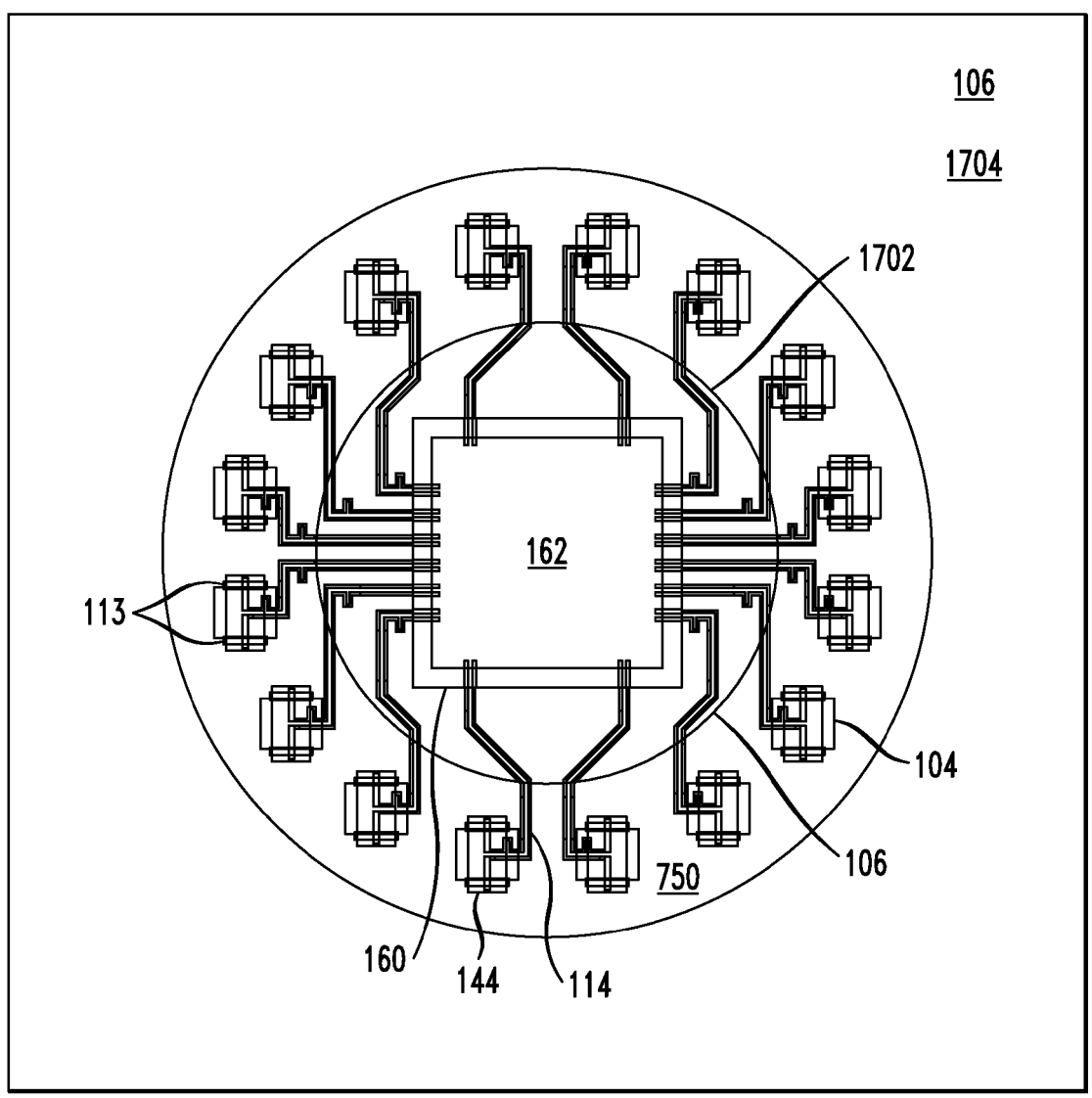
FIG. 18 is a top view of another exemplary sixteen antenna phased-array configuration, according to an additional aspect of the invention.

FIGS. 17-18 show first (receiver) and second (transmitter) sixteen antenna element phased configurations. In FIGS. 17 and 18, as in the other illustrative island embodiments, cavity 750 is defined in layers 106, 108, 109, having island 1702 and outer portion 1704. For the configurations in FIGS. 17 and 18, the package size is only 28 mm×28 mm, with a 46 mil height (into the page) (note 46 mil=0.046 inches=1.17 mm). In FIG. 17, the RF chip 162 requires coplanar waveguide (CPW) feed antennas so there are sixteen microstrip to CPW transitions 1902. Chip 162 resides in chip cavity 160. Note also feed lines 114, reflectors 144, and ground plane slots 113. The configuration of FIG. 17 employs one ground plane slot per patch, while that in FIG. 18 employs two ground plane slots 113 per patch 104. Note also FIGS. 17 and 18 are top views where dashed (hidden) lines are not used, for illustrative convenience—chip 162 in cavity 160 is located below island 1702, just as in FIGS. 7-14.

One or more embodiments of the invention thus provide a package with a socket 160 for an RF chip 162, and an internal cavity 750 for planar antenna arrays. The antenna cavity 750 can be, for example, a circular or rectangular ring, or a large cavity for side-by-side configurations (an example of the latter is shown in FIGS. 15 and 16). Embodiments of the package can implement a planar phased array, preferably without the need for vias for RF feed, and in one or more embodiments, with a substantially equal, and relatively short, feed line length. If a relative larger phased array is required, more antenna elements can be used by enlarging the cavity size, as shown in FIGS. 9-12.

In view of the description of FIGS. 7-18, it will be appreciated that, in general terms, a radio-frequency integrated circuit chip package with N integrated aperture-coupled patch antennas, N being at least two, includes N generally planar patches 104, as well as at least one generally planar ground plane 110 spaced inwardly from the N generally planar patches and substantially parallel thereto. The ground plane is formed with N coupling aperture slots 113 therein, and the slots are substantially opposed to the patches 104 (in some instances, such as FIG. 18, there may be more than N slots—for example, 2N slots, two slots for each patch). N feed lines 114 are spaced inwardly from the ground plane 110 and substantially parallel thereto. At least one radio frequency chip 162 is spaced inwardly from the feed lines 114 and coupled to the feed lines 114 and the ground plane 110. Note that vias, pads, and anti-pads as described with respect to FIGS. 1-6 can also be used in the embodiments of FIGS. 7-18. The N patches 104 can be arranged to form a planar phased array.

A first substrate layer, such as that formed by bound film 126 and substrate 128, is spaced inwardly from the feed lines 114, and is formed with a chip-receiving cavity 160, with the chip 162 being located in the chip-receiving cavity. A second substrate layer, such as that formed by films 106, 109 and substrate 108, is interposed in a region between the ground plane 110 and a plane defined by the patches 104. The patches 104 are formed in a first metal layer, the ground plane 110 is formed in a second metal layer, and the second substrate layer defines an antenna cavity 750, with the N generally planar patches 104 being located in the antenna cavity 750.

In some instances, an island 702, 1702 is formed in the second substrate layer, within the cavity 750, thus defining a ring shape of the cavity, and the N generally planar patches 104 are located in the ring shape, with the island 702, 1702 being substantially opposed to the chip-receiving cavity 160. "Substantially opposed," as used herein, is intended to describe a configuration where the island at least partially overlaps the chip-receiving cavity when viewed in plan, to help support insertion loads from insertion of chip 162 into cavity 160. The island and the cavity may have a variety of shapes, and may have the same or different shapes in any particular instance. In some exemplary, non-limiting cases, both are substantially rectangular (rectangular encompassing, but not limited to, square) when viewed in plan, while in other, exemplary, non-limiting cases, both are substantially circular when viewed in plan.

In some instances, a third substrate layer, such as that formed by substrate 112, is interposed in a region between the ground plane 110 and the feed lines 114, and the feed lines 114 are formed in a third metal layer. In one or more embodiments, N reflectors 144 are spaced inwardly from the third substrate layer and generally opposed to the coupling aperture slots 113. The reflectors 144 can be located, for example, on an inner surface of the first substrate layer. Furthermore, in some instances, a fourth substrate layer, such as that formed by bound film 170 and substrate 172, is spaced inwardly from the reflectors 144, with the reflectors 144 being embedded between the first and fourth substrate layers.

In other instances, such as shown in FIGS. 15 and 16, the antenna cavity 750 is spaced away from the chip-receiving cavity 160 when viewed in plan, such that loads incurred during insertion of the chip 162 into the chip-receiving cavity 160 are substantially supported away from the antenna cavity (for example, by compression in the layers 102, 108, 106, 109, 110, 112 immediately over chip 162).

In some instances, a cover, such as layer 102, is secured over the antenna cavity 750, and is at least partially supported by the island 702.

In another aspect, a method of fabricating a radio-frequency integrated circuit chip package of the kind described includes providing a package of the kind described, without the chip 162 inserted, and with the island 702 as described, as well as inserting at least one radio frequency chip 162 into the cavity 160, with the island 702 supporting loads induced by the insertion of the chip into the cavity.

In yet another aspect, a method of fabricating a radio-frequency integrated circuit chip package of the kind described includes providing a package of the kind described, without the chip 162 inserted, and with the antenna cavity spaced away from the chip-receiving cavity when viewed in plan (as shown, for example, in FIGS. 15 and 16), as well as inserting at least one radio frequency chip 162 into the cavity 160, such that loads incurred during insertion of the chip 162 into the chip-receiving cavity 160 are substantially supported away from the antenna cavity (for example, by compression in the layers 102, 108, 106, 109, 110, 112 immediately over chip 162).

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A radio-frequency integrated circuit chip package with N integrated aperture-coupled patch antennas, N being at least two, said package comprising:
   N generally planar patches;
   at least one generally planar ground plane spaced inwardly from said N generally planar patches and substantially parallel thereto, said ground plane being formed with at least N coupling aperture slots therein, said slots being substantially opposed to said patches;
   N feed lines spaced inwardly from said ground plane and substantially parallel thereto;
   at least one radio frequency chip spaced inwardly from said feed lines and coupled to said feed lines and said ground plane;
   a first substrate layer spaced inwardly from said feed lines, said first substrate layer being formed with a chip-receiving cavity, said chip being located in said chip-receiving cavity; and
   a second substrate layer interposed in a region between said ground plane and a plane defined by said patch, wherein:
   said patch is formed in a first metal layer;
   said ground plane is formed in a second metal layer; and
   said second substrate layer defines an antenna cavity, said N generally planar patches being located in said antenna cavity.

2. The package of claim 1, further comprising an island formed in said second substrate layer, within said antenna cavity, thus defining a ring shape of said cavity, said island being substantially opposed to said chip-receiving cavity.

3. The package of claim 2, wherein said island and said antenna cavity are substantially rectangular when viewed in plan.

4. The package of claim 2, wherein said island and said antenna cavity are substantially circular when viewed in plan.

5. The package of claim 2, further comprising a third substrate layer interposed in a region between said ground plane and said feed lines, wherein said feed lines are formed in a third metal layer.

6. The package of claim 5, further comprising N reflectors spaced inwardly from said third substrate layer and generally opposed to said coupling aperture slots.

7. The package of claim 6, wherein said reflectors are located on an inner surface of said first substrate layer.

8. The package of claim 7, further comprising a fourth substrate layer spaced inwardly from said reflectors, said reflectors being embedded between said first and fourth substrate layers.

9. The package of claim 2, further comprising a cover, wherein said island is configured to support said cover.

10. The package of claim 1, wherein said N patches are arranged to form a planar phased array.

11. The package of claim 1, wherein said antenna cavity is spaced away from said chip-receiving cavity when viewed in plan, such that loads incurred during insertion of said chip into said chip-receiving cavity are substantially supported away from said antenna cavity.

12. The package of claim 1, wherein said ground plane is formed with at least 2N of said coupling aperture slots therein, two of said coupling aperture slots for each of said patches.

13. A method of fabricating a radio-frequency integrated circuit chip package with N integrated aperture-coupled patch antennas, N being at least two, said method comprising the steps of:
  providing a package comprising:
    N generally planar patches;
    at least one generally planar ground plane spaced inwardly from said N generally planar patches and substantially parallel thereto, said ground plane being formed with at least N coupling aperture slots therein, said slots being substantially opposed to said patches;
    N feed lines spaced inwardly from said ground plane and substantially parallel thereto;
    a first substrate layer spaced inwardly from said feed lines, said first substrate layer being formed with a chip-receiving cavity;
    a second substrate layer interposed in a region between said ground plane and a plane defined by said patch, wherein:
      said patch is formed in a first metal layer;
      said ground plane is formed in a second metal layer; and
      said second substrate layer defines an antenna cavity, said N generally planar patches being located in said antenna cavity; and
    an island formed in said second substrate layer, within said antenna cavity, thus defining a ring shape of said cavity, said island being substantially opposed to said chip-receiving cavity; and
  inserting at least one radio frequency chip into said chip-receiving cavity, with said island supporting loads induced by said insertion of said chip into said chip-receiving cavity.

14. The method of claim 13, further comprising the additional step of securing a cover over said antenna cavity, with said cover being supported, at least in part by said island.

15. A method of fabricating a radio-frequency integrated circuit chip package with N integrated aperture-coupled patch antennas, N being at least two, said method comprising the steps of:
  providing a package comprising:
    N generally planar patches;
    at least one generally planar ground plane spaced inwardly from said N generally planar patches and substantially parallel thereto, said ground plane being formed with at least N coupling aperture slots therein, said slots being substantially opposed to said patches;
    N feed lines spaced inwardly from said ground plane and substantially parallel thereto;
    a first substrate layer spaced inwardly from said feed lines, said first substrate layer being formed with a chip-receiving cavity;
    a second substrate layer interposed in a region between said ground plane and a plane defined by said patch, wherein:
      said patch is formed in a first metal layer;
      said ground plane is formed in a second metal layer;
      said second substrate layer defines an antenna cavity, said N generally planar patches being located in said antenna cavity; and
      said antenna cavity is spaced away from said chip-receiving cavity when viewed in plan; and
  inserting at least one radio frequency chip into said chip-receiving cavity, such that loads incurred during insertion of said chip into said chip-receiving cavity are substantially supported away from said antenna cavity.

* * * * *